United States Patent
Burr et al.

(10) Patent No.: US 10,453,528 B1
(45) Date of Patent: Oct. 22, 2019

(54) CONTROLLING AGGREGATE SIGNAL AMPLITUDE FROM DEVICE ARRAYS BY SEGMENTATION AND TIME-GATING

(71) Applicant: INTERNATIONAL BUSINESS MACHINES CORPORATION, Armonk, NY (US)

(72) Inventors: Geoffrey W. Burr, San Jose, CA (US); Pritish Narayanan, San Jose, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/008,966

(22) Filed: Jun. 14, 2018

(51) Int. Cl.
G11C 11/00 (2006.01)
G11C 13/00 (2006.01)
G06N 3/02 (2006.01)
G11C 11/54 (2006.01)

(52) U.S. Cl.
CPC .......... G11C 13/0061 (2013.01); G06N 3/02 (2013.01); G11C 11/54 (2013.01); G11C 13/0038 (2013.01); G11C 13/0004 (2013.01); G11C 2213/79 (2013.01)

(58) Field of Classification Search
CPC . G11C 13/0061; G11C 11/54; G11C 13/0038; G11C 13/0004; G11C 2213/79
See application file for complete search history.

(56) References Cited

U.S. PATENT DOCUMENTS

| 5,040,134 | A | 8/1991 | Park |
| 8,111,494 | B2 | 2/2012 | Pickett et al. |
| 8,694,452 | B2 | 4/2014 | Aparin et al. |
| 9,152,827 | B2 * | 10/2015 | Linderman .............. G06G 7/16 |
| 9,852,790 | B1 * | 12/2017 | Gokmen .................. G06N 3/02 |
| 9,910,827 | B2 * | 3/2018 | Muralimanohar ...... G06F 17/16 |
| 2016/0336064 | A1 | 11/2016 | Seo et al. |
| 2017/0033120 | A1 | 2/2017 | Lee et al. |

FOREIGN PATENT DOCUMENTS

KR  20170108627  9/2017

* cited by examiner

Primary Examiner — Pho M Luu
(74) Attorney, Agent, or Firm — Erik Huestis; Stephen Kenny; Foley Hoag LLP

(57) ABSTRACT

High dynamic range resistive arrays are provided. An array of resistive elements provides a vector of current outputs equal to the analog vector-matrix product between (i) a vector of voltage inputs to the array encoding a vector of analog input values and (ii) a matrix of analog resistive weights within the array. First stage current mirrors are electrically coupled to a subset of the resistive elements through a local current accumulation wire. A second stage current mirror is electrically coupled to the first stage current mirrors through a global accumulation wire. Each of the first stage current mirrors includes at least one component having respective scaling factors selectable to scale up or down the current in the local current accumulation wire, thus controlling the aggregate current on the global accumulation wire.

19 Claims, 14 Drawing Sheets

CONTROLLING AGGREGATE SIGNAL AMPLITUDE FROM DEVICE ARRAYS BY SEGMENTATION AND TIME-GATING

BACKGROUND

Embodiments of the present disclosure relate to crossbar memories, and more specifically, to controlling aggregate signal amplitude from device arrays by segmentation and time-gating.

BRIEF SUMMARY

According to embodiments of the present disclosure, devices and circuits for high dynamic range resistive arrays are provided. An array of resistive elements provides a vector of current outputs equal to the analog vector-matrix product between (i) a vector of voltage inputs to the array encoding a vector of analog input values and (ii) a matrix of analog resistive weights within the array. First stage current mirrors are electrically coupled to a subset of the resistive elements through a local current accumulation wire. A second stage current mirror is electrically coupled to the first stage current mirrors through a global accumulation wire. Each of the first stage current mirrors includes at least one component having respective scaling factors selectable to scale up or down the current in the local current accumulation wire, thus controlling the aggregate current on the global accumulation wire.

According to embodiments of the present disclosure, methods of operating a crossbar array are provided. A vector of voltage inputs is provided to an array of resistive elements. The array is adapted to provide a vector of current outputs equal to the analog dot-product between the vector of voltage inputs and a vector of analog resistive weights within the array. First stage current mirrors are electrically coupled to a subset of the resistive elements through a local current accumulation wire. A second stage current mirror is electrically coupled to the first stage current mirrors through a global accumulation wire. Each of the first stage current mirrors includes at least one component having respective scaling factors. An aggregate current on the global accumulation wire is controlled by selecting a scaling factor for the components of the first stage current mirrors.

DETAILED DESCRIPTION

Artificial neural networks (ANNs) are distributed computing systems, which consist of a number of neurons interconnected through connection points called synapses. Each synapse encodes the strength of the connection between the output of one neuron and the input of another. The output of each neuron is determined by the aggregate input received from other neurons that are connected to it. Thus, the output of a given neuron is based on the outputs of connected neurons from the preceding layer and the strength of the connections as determined by the synaptic weights. An ANN is trained to solve a specific problem (e.g., pattern recognition) by adjusting the weights of the synapses such that a particular class of inputs produce a desired output.

ANNs may be implemented on various kinds of hardware, including crossbar arrays, also known as crosspoint arrays or crosswire arrays. A basic crossbar array configuration includes a set of conductive row wires and a set of conductive column wires formed to intersect the set of conductive row wires. The intersections between the two sets of wires are separated by crosspoint devices. Crosspoint devices function as the ANN's weighted connections between neurons.

Figure 1:
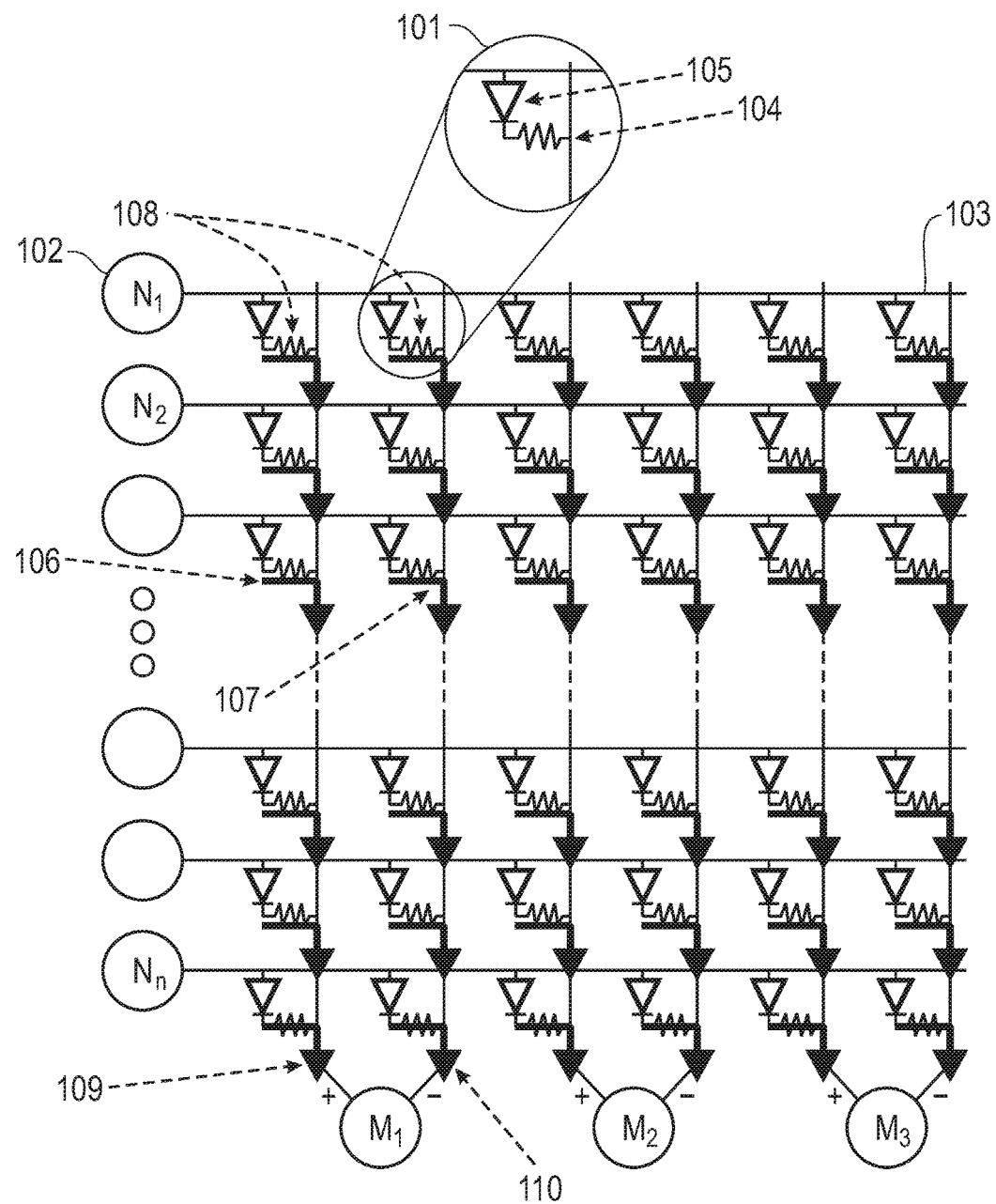
FIG. 1 illustrates an exemplary nonvolatile memory-based crossbar array, or crossbar memory.

Referring to FIG. 1, an exemplary nonvolatile memory-based crossbar array, or crossbar memory, is illustrated. A plurality of junctions 101 are formed by row lines 102 intersecting column lines 103. A resistive memory element 104, such as a non-volatile memory, is in series with a selector 105 at each of the junctions 101 coupling between one of the row lines 102 and one of the column lines 103. The selector may be a volatile switch or a transistor, various types of which are known in the art.

It will be appreciated that a variety of resistive memory elements are suitable for use as described herein, including memristors, phase-change memories, conductive-bridging RAMs, spin-transfer torque RAMs.

Figure 2:
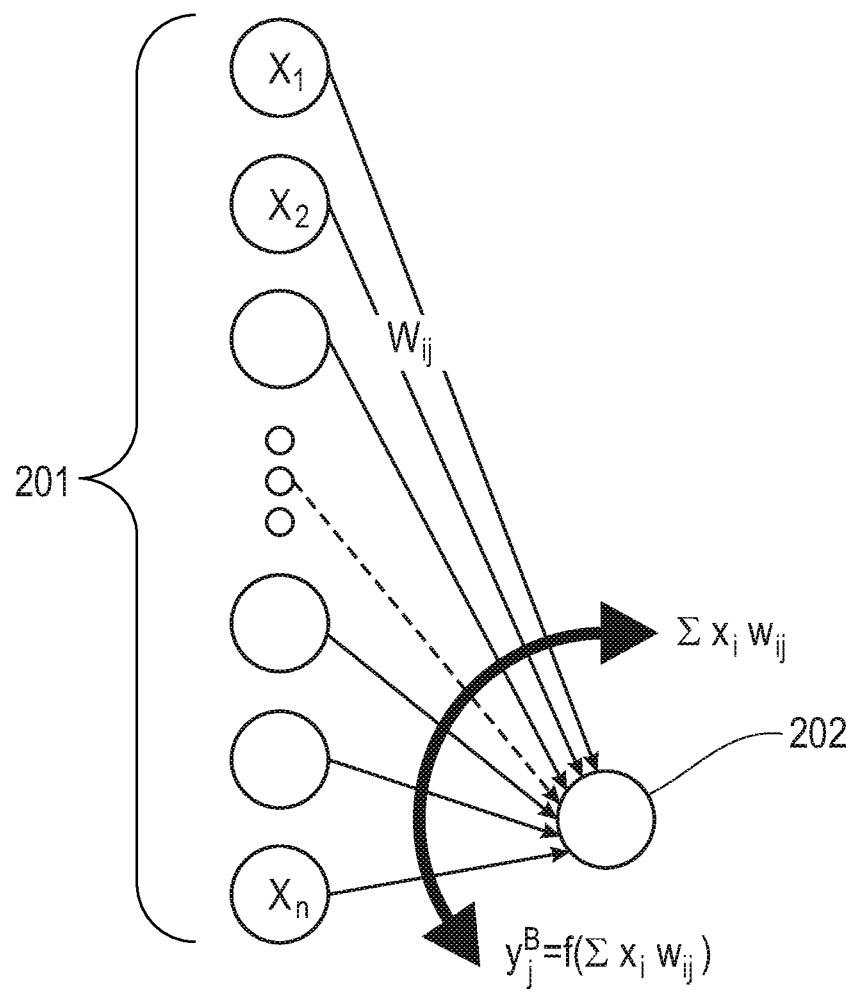
FIG. 2 illustrates exemplary synapses within a neural network.

Referring to FIG. 2, exemplary synapses within a neural network are illustrated. A plurality of inputs $x_1 \ldots x_n$ from nodes 201 are multiplied by corresponding weights $w_{ij}$. The sum of the weights, $\Sigma x_i w_i$ is provided to a function $f(\bullet)$ at node 202 to arrive at a value $y_j^B = f(\Sigma x_i w_{ij})$. It will be appreciated that a neural network would include a plurality of such connections between layers, and that this is merely exemplary.

Mapping the exemplary synapses of FIG. 2 onto the crossbar array of FIG. 1, the current at the output 106, 107 of each junction is given as $I = G^+V(t)$ and $I = G^-V(t)$ where $G^+$ and $G^-$ correspond to $w_{ij}$ for the given resistive memory, and $V(t)$ correspond to $x_i$ for the given input row line. In this example, the column lines are arranged in adjacent conductance pairs 108. The aggregate outputs 109, 110 are thus given as $I = \Sigma G^+V$ and $I = \Sigma G^-V$ for each conductance pair 108.

In such crossbar memories, the aggregate output current can be extremely high. In addition, large voltage drops and electromigration may lead to a loss of functionality of the array. Moreover, to sense a single input device or crosspoint (rather than the aggregate read current from many devices), downstream peripheral circuitry would need to have a very high dynamic range.

In particular, for neuromorphic and other applications such as vector-matrix multiplication, a crossbar memory is not well adapted to situations in which input signal current from any one device is already significant enough to be measurable. In such a situation, the aggregate signal from all such devices can be far too large, swamping any reasonable capacitor at the periphery. While a below-unity current gain can be applied at the periphery before applying this current to an integrating capacitor, additional problems arise. For instance, a large aggregate current can overload the row lines and column lines to the extent that undesired voltage drops are introduced. In some circumstances, damage by electromigration may result.

According, there is a need to reduce aggregate current before it has a chance to sum up along the row lines and column lines, and/or to proportionally reduce the amount of charge integrated onto a modest-sized integration capacitor.

To address this need, the present disclosure provides for segmentation of crossbar arrays, and for time-gating of crossbar arrays.

In various embodiments, a crossbar array is organized into segments. For instance, an array of 1024 lines may be segmented into 64 or 128 column segments. At the edge of each segment, current mirrors with less-than-unity gain map the currents on the local row and column lines onto global row and column lines. For the purposes of being able to read the much smaller non-aggregated current from a single row or column of devices, other current mirrors with greater-than-unity gain can be included and enabled for such single-row/column reads. This segment circuitry must also support all other read and write modes, during which it may be necessary to short the local and global row/column lines together.

Figure 3:
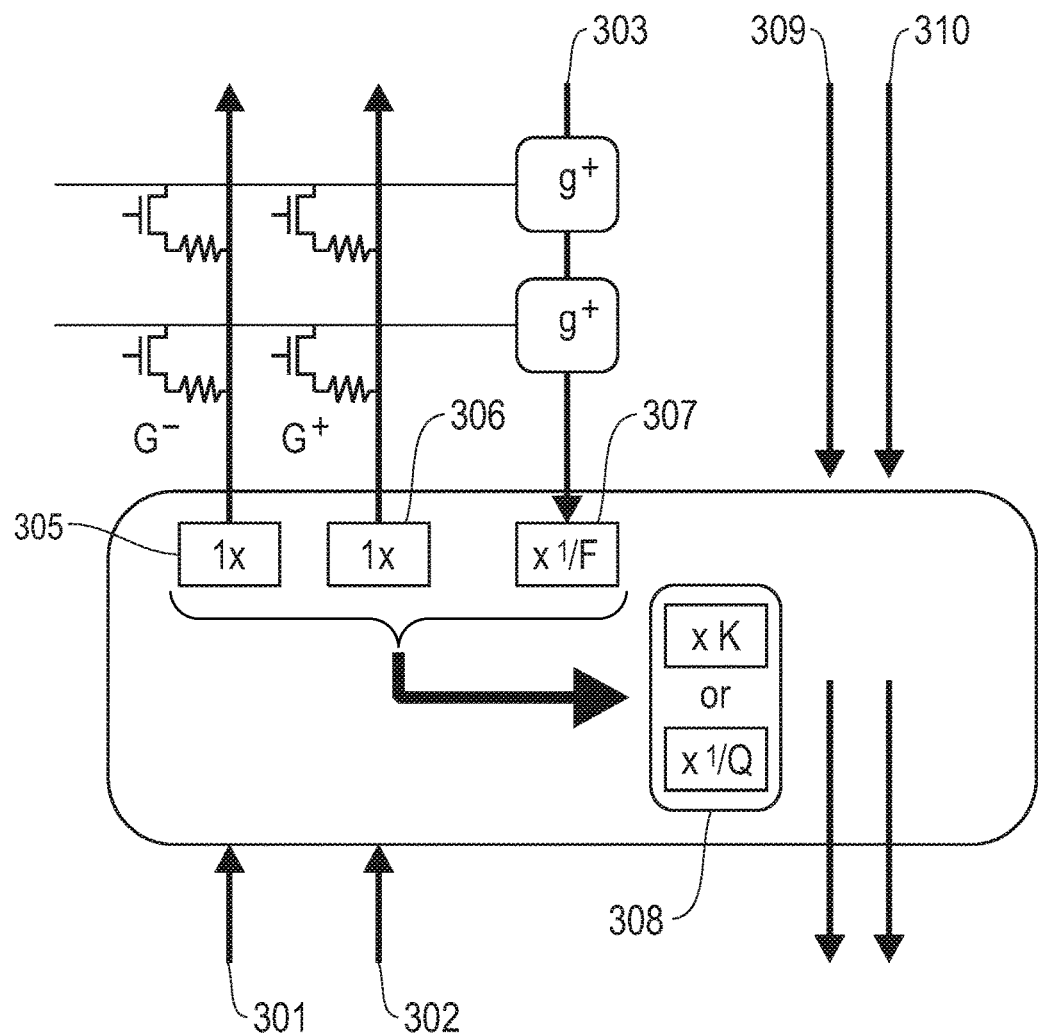
FIG. 3 illustrates an exemplary segment of a crossbar memory according to embodiments of the present disclosure.

Referring to FIG. 3, an exemplary segment of a crossbar memory according to embodiments of the present disclosure is illustrated. In this embodiment, each segment has scaled current mirrors that feed into a global line. During an aggregate read, current is scaled down using 1/Q current mirror. During a single device read, a K mirror is used to scale up the current.

In FIG. 3, three local signals 301, 302, 303 (G+, G−, and g+) arrive at peripheral circuitry 304 at the edge of a segment. In this example, the segment corresponds to two columns of a crossbar memory such as that depicted in FIG. 1. However, it will be appreciated that this is merely exemplary, and a memory array may be segmented by rows, by columns, or both. Moreover, in various embodiments, a given segment spans multiple rows or columns, e.g., 64. Input signals 301, 302 pass through individual mirrors 305, 306. Mirrors 305, 306 apply no scaling. Input signal 303 passes through mirror 307. Mirror 307 scales the current down by a factor of F, corresponding to the relative weight of the read current from the $G^+$, $G^-$ devices as compared to the read current of the $g^+$ devices. In this way, the relative gain is determined.

The outputs of mirrors 305 . . . 307, are summed together. In this example, $G^+$ is added to $g^+/F$ and then passed through one of two mirrors 308. The mirrors 308 either apply a 1× gain or a 1/Q sub-unity gain. This current contribution is added to the existing global current lines 309, 310 ($I_{in}^+$ and $I_{in}^-$) that are already passing current from other segments (not shown).

Figure 4:
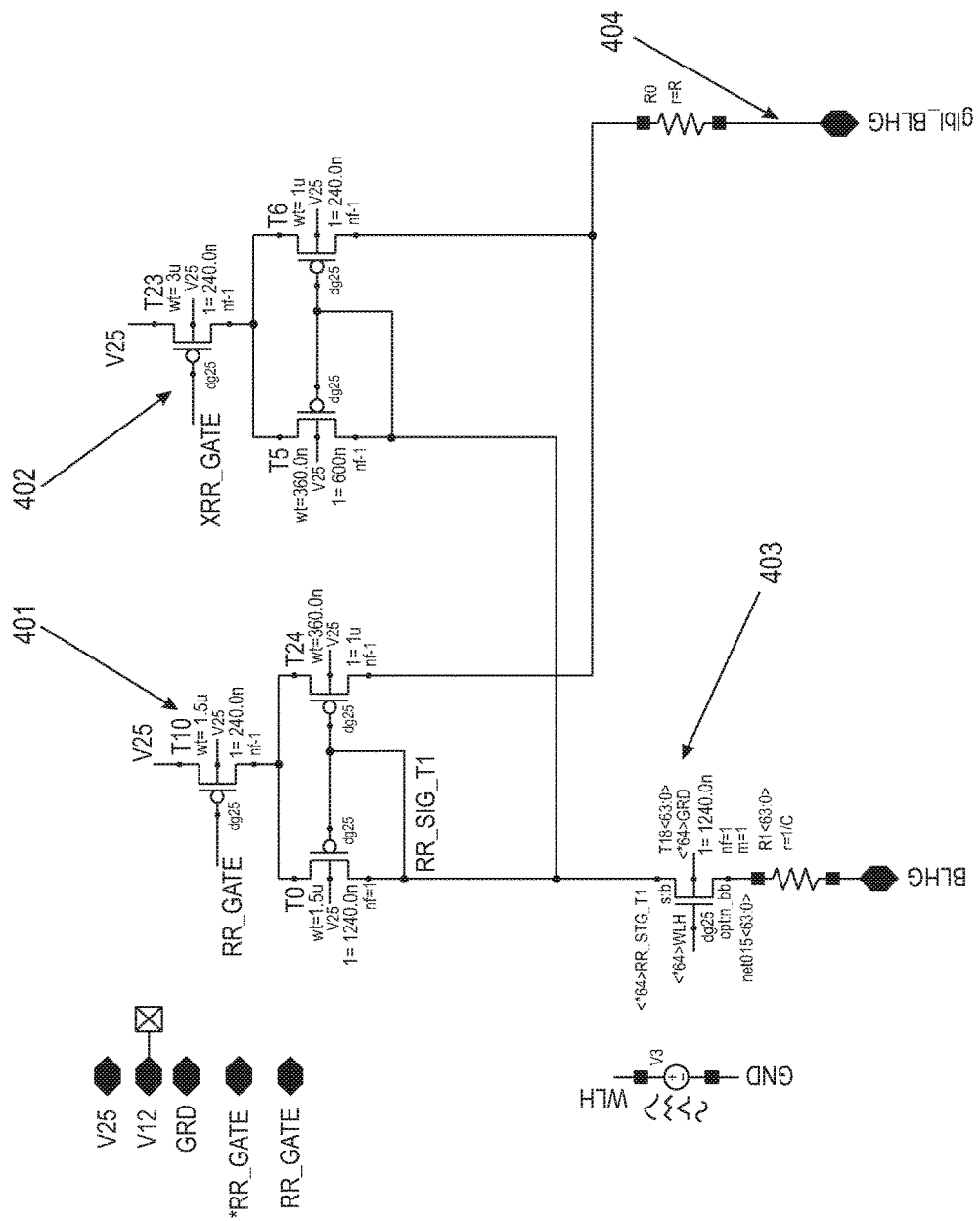
FIG. 4 is an exemplary circuit diagram for an embodiment of a segment of a crossbar memory according to the present disclosure.

Referring to FIG. 4, an exemplary circuit diagram for an embodiment of a segment of a crossbar memory according to embodiments of the present disclosure is provided. The circuit of FIG. 4 reflects an exemplary embodiment of the segment of FIG. 3. In particular, two mirrors 401, 402 implement two different scale factors, and are enabled by control gates. This exemplary segment is responsible for 64 PCM devices 403. A global wire 404 connects all segments.

Figure 5A:
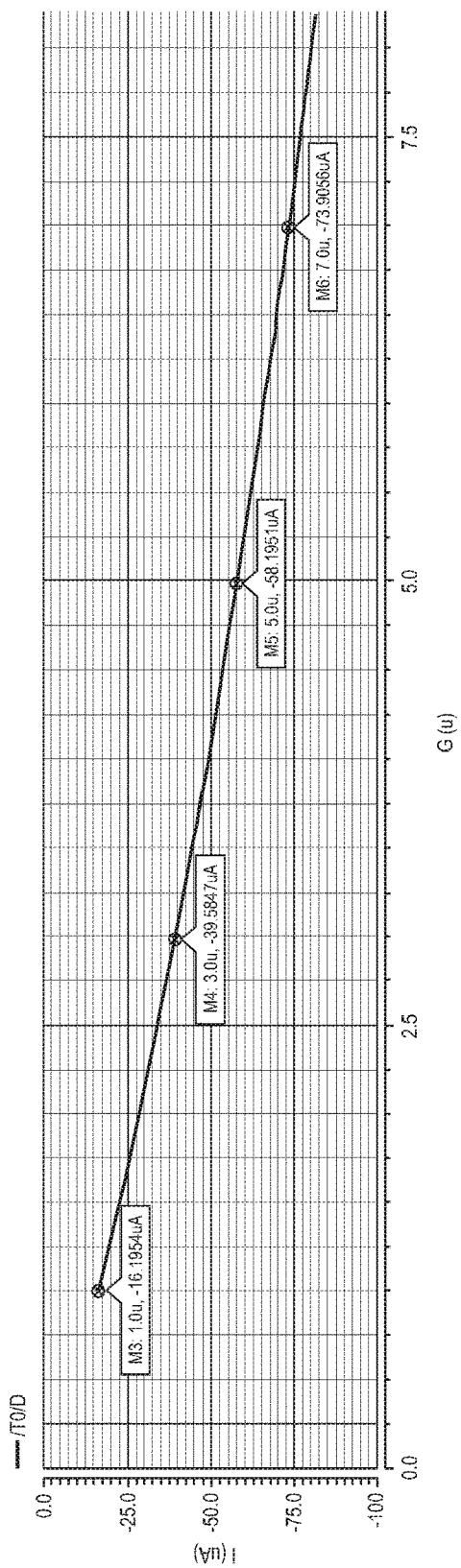
FIGS. 5A-C are a plot of the aggregate current in an exemplary embodiment having 64 devices in parallel.
Figure 5B:
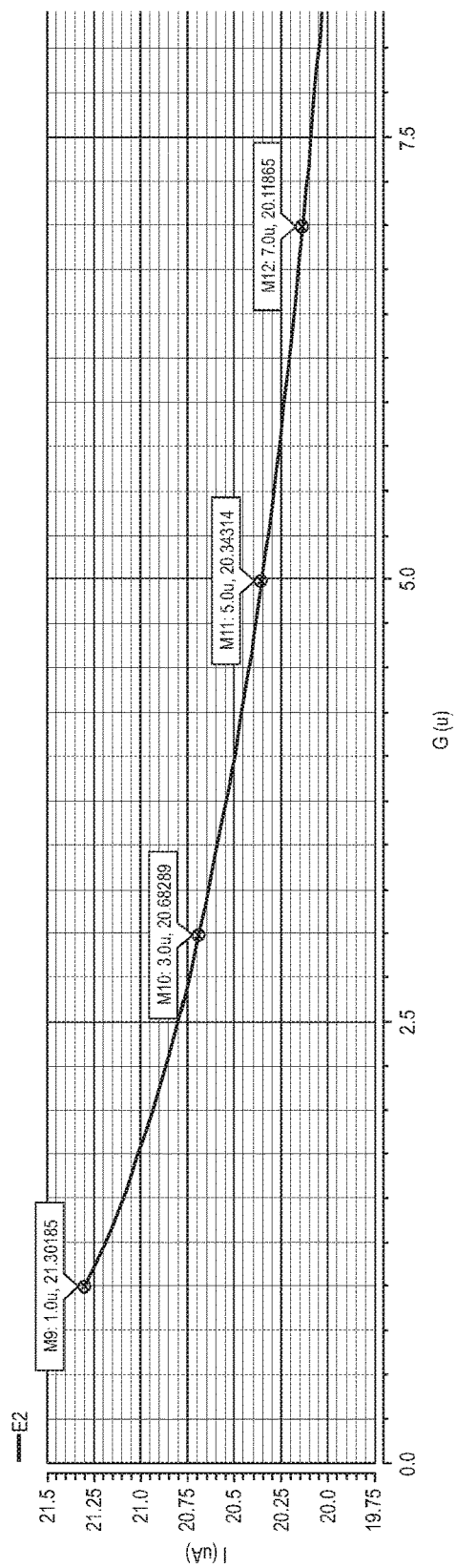
Figure 5C:
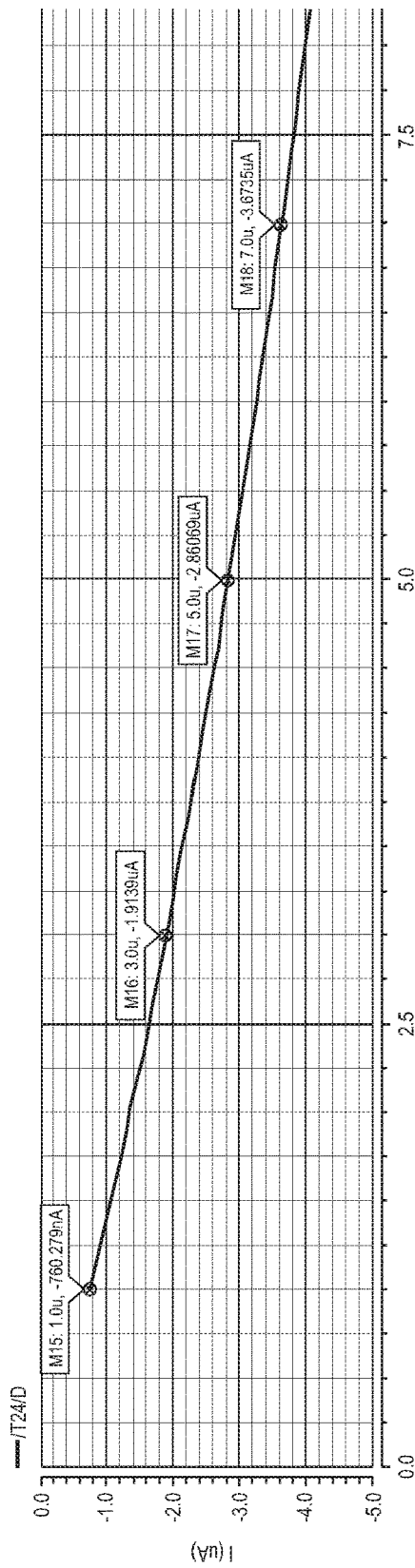

Referring to FIG. 5, the aggregate current in an exemplary embodiment having 64 devices in parallel is plotted. In particular, the x-axis corresponds to the conductance of each non-volatile memory device within a segment. FIG. 5A reflects the unscaled aggregate current. FIG. 5B reflects the current scale factor of the 1/Q mirror. FIG. 5C reflects the scaled current after the 1/Q reduction.

Figure 6A:
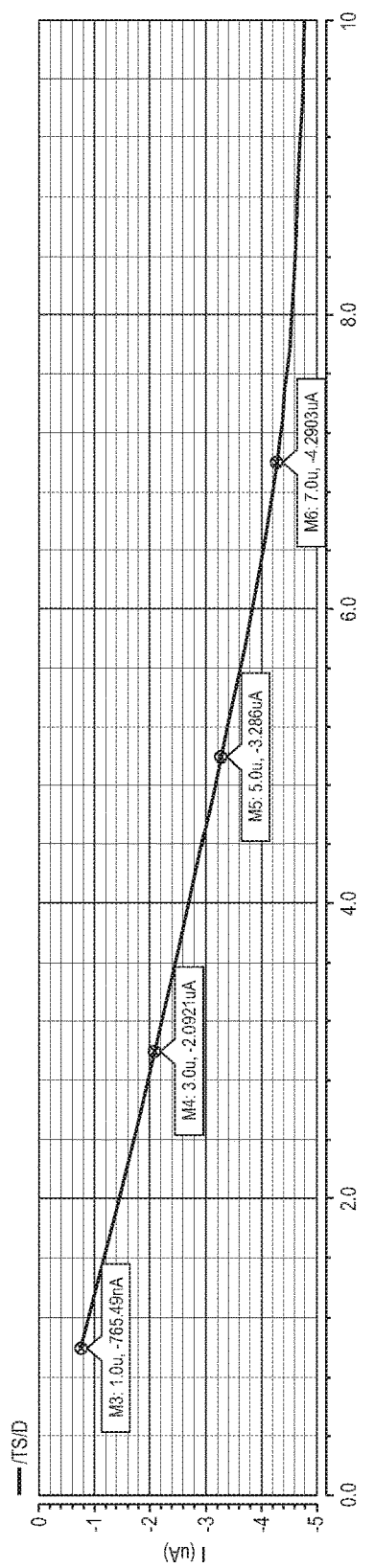
FIGS. 6A-C are a plot of the aggregate current in an exemplary embodiment when reading a single unit cell.
Figure 6B:
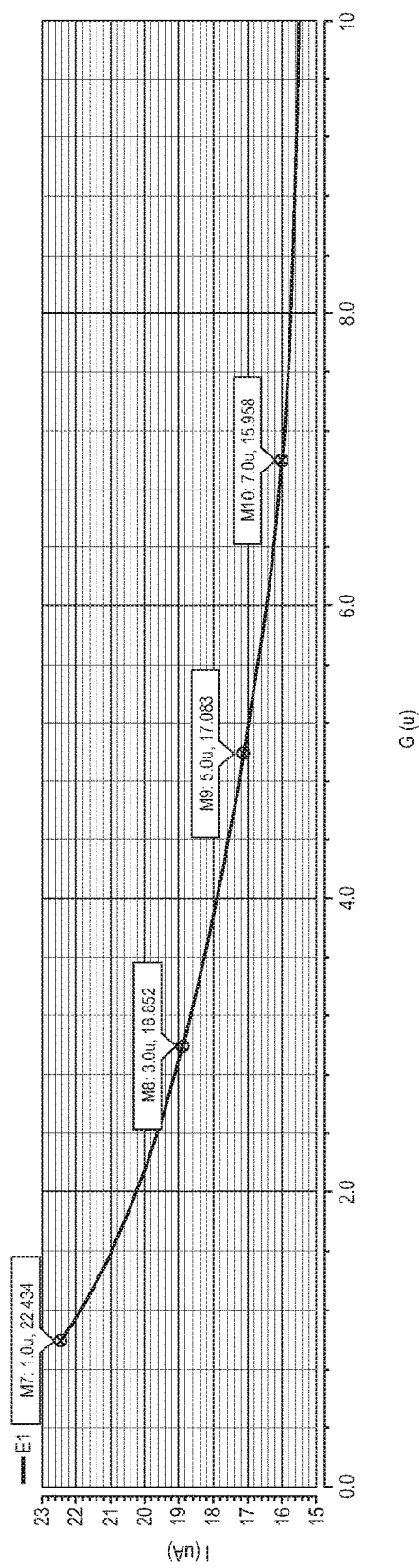
Figure 6C:
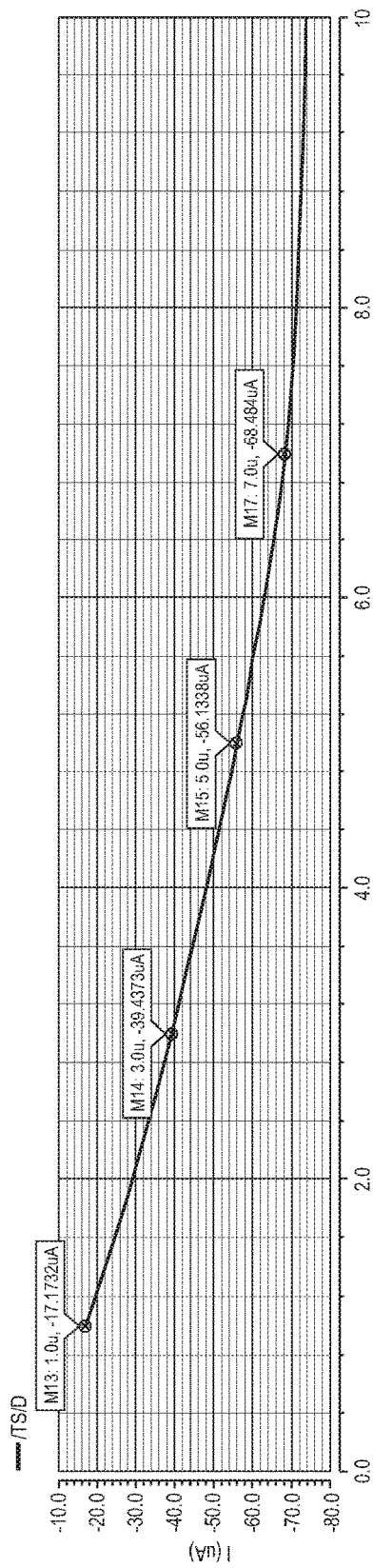

Referring to FIG. 6, the aggregate current in an exemplary embodiment when reading a single unit cell is plotted. In particular, the x-axis corresponds to the conductance of each non-volatile memory device. FIG. 6A reflects the unscaled current. FIG. 6B reflects the effective scale factor. FIG. 6C reflects the scaled up current.

In various embodiments, peripheral circuitry includes a capacitor that is charged or discharged by the output of the columns of the memory array. Such a capacitor may serve to accumulate the output of the memory array over a period of time, thereby determining the output signal at the end of a predetermined time window. In order to prevent overcharging of the capacitor, some embodiments employ time-gating of the memory array output.

Figure 7:
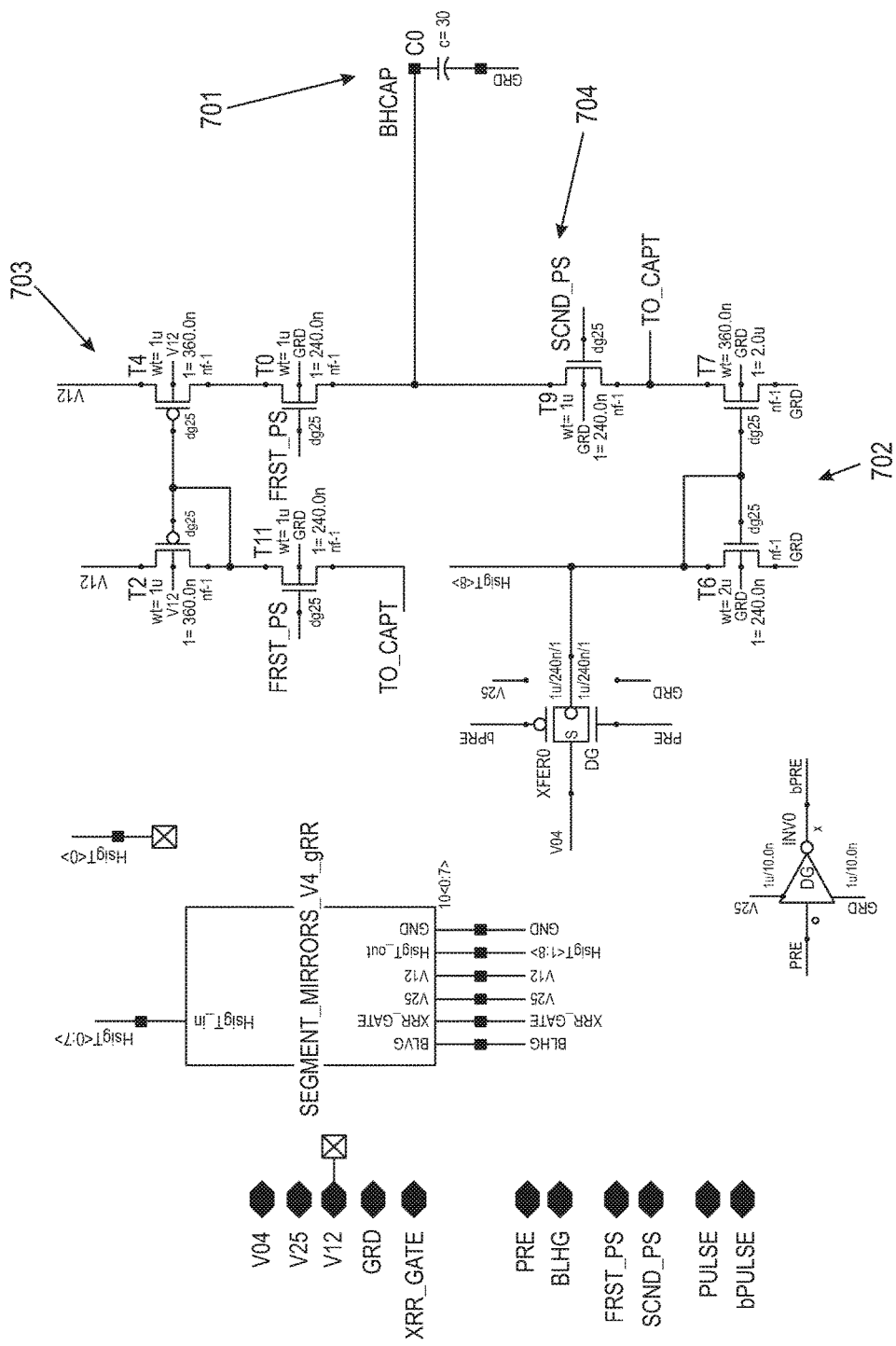
FIG. 7 is an exemplary circuit diagram for an embodiment of a time-gated crossbar memory according to the present disclosure.

Referring to FIG. 7, an exemplary circuit diagram for an embodiment of a time-gated crossbar memory according to embodiments of the present disclosure is provided. Capacitor 701 receives the output from peripheral mirrors 702, 703. Control signal 704 (SCND_PS) is pulsed, allowing edge capacitor 701 to be filled a fraction of the time. This allows for capacitor 701 to have a smaller size while overall current in the memory array remains high.

In particular, the current flowing to the capacitor may be turned on and off for a fraction of the integration time. For example, in some embodiments, the current may be on for 1ns, and off for 4 ns, causing a 5:1 suppression of current. In various embodiments, time-gating may be provided in the segment current mirrors 305, 306 or in the current mirror 308 at the edge of peripheral circuitry 304, as described above in connection with FIG. 3.

Figure 8:
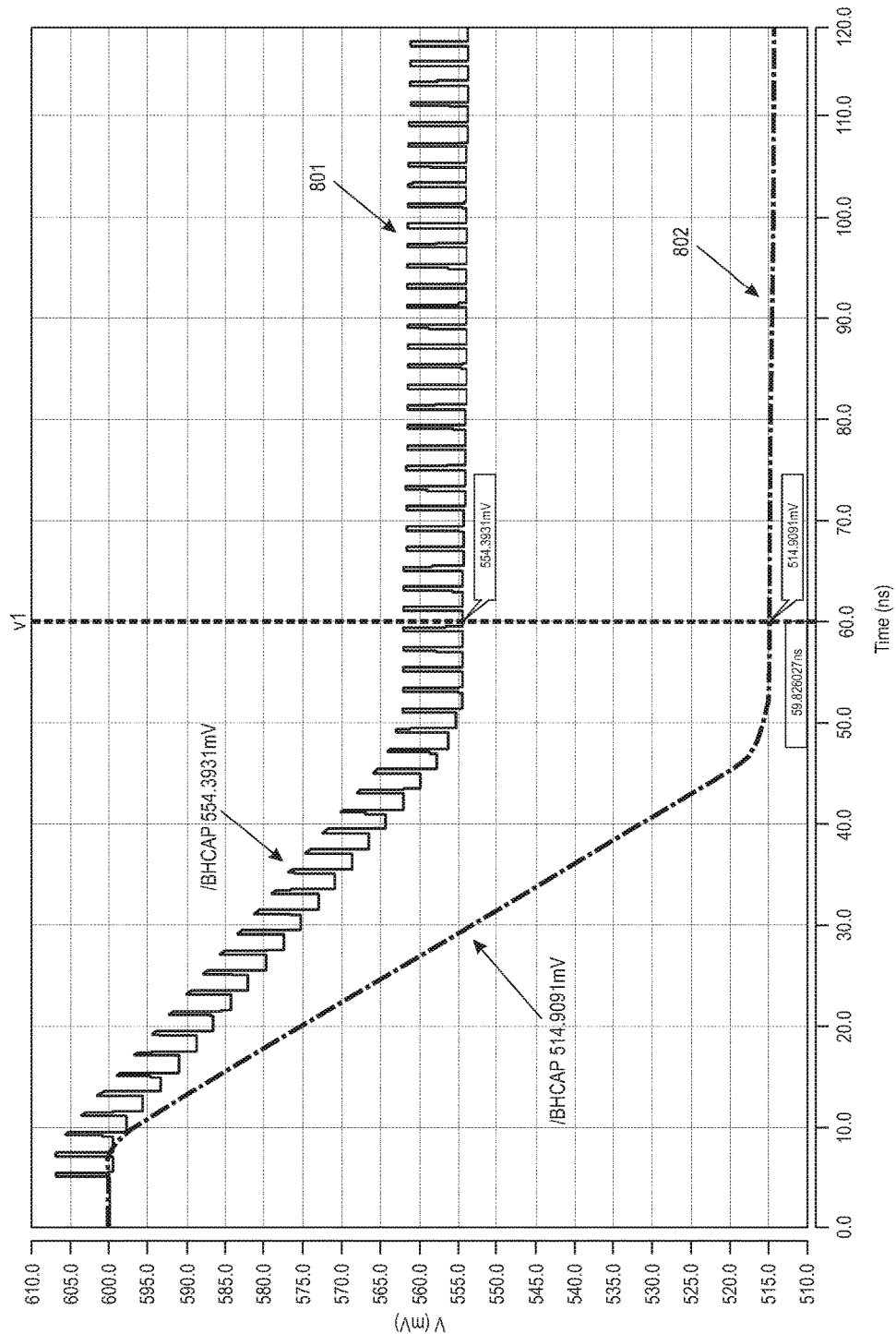
FIG. 8 is a plot of peripheral capacitor voltage according to embodiments of the present disclosure.

Referring to FIG. 8, peripheral capacitor voltage is plotted according to embodiments of the present disclosure. With pulsing, there is a 45 mV drop in the capacitor voltage level 801. Without pulsing there is an 85 mV drop in the capacitor voltage level 802. This corresponds to a 1.9:1 suppression of current onto the capacitor.

As set forth above, in various embodiments, circuits are provided that offer a high dynamic range for aggregating current from all or a portion of a resistive array. The current is equal to the analog dot-product between a vector of voltage inputs to the array encoding a vector of analog input values and a vector of analog resistive weights within the array. In this way, the resistive array may be used to implement an artificial neural network. The array may be divided into subsets of resistive elements. The circuit includes first stage current mirrors and a second stage current mirror. Each of the first stage current mirrors is electrically coupled to one of the subsets of resistive elements through a local current accumulation wire. The second stage current mirror is electrically coupled to the first stage current mirrors through a global accumulation wire. Each of the first stage current mirrors includes components having respective scaling factors that can be selected to scale down the current in the local current accumulation wire, thus controlling the aggregate current flowing on the global accumulation wire.

In various embodiments, a time-gating circuit is included for periodically enabling at least one of the first stage and/or second stage current mirrors, thereby controlling the fraction of time during which current is sensed.

In various embodiments, the second stage current mirror includes at least one component having scaling factors that can be selected to scale down the current from the global current accumulation wire.

In various embodiments, multiple circuits are electrically coupled together to form an array.

In various embodiments, the resistive elements are non-volatile memory devices. In various embodiments, the resistive elements are transistors whose gate terminals are connected to respective capacitors. In various embodiments, the resistive elements store synaptic weights of a neural network.

In various embodiments, circuits are provided that offer a wide dynamic range for aggregating current from all or a portion of a resistive array. The current is equal to the strength of a stored analog resistive weight within the array. The array includes subsets of resistive elements. The circuit includes first stage current mirrors and a second stage current mirror. Each of the first stage current mirrors are electrically coupled to one of the subsets of resistive elements through a local current accumulation wire. The second stage current mirror is electrically coupled to the first stage current mirrors through a global accumulation wire. Each of the first stage current mirrors includes components having respective scaling factors that can be selected to selectively amplify the current in the local current accumulation wire, thus controlling the aggregate current flowing on the global accumulation wire.

In various embodiments, the second stage current mirror includes at least one component having scaling factors that can be selected to amplify the current from the global current accumulation wire.

In various embodiments, multiple circuits are electrically tied together to form an array.

In various embodiments, the resistive elements are non-volatile memory devices. In various embodiments, the resistive elements are transistors whose gate terminals are connected to respective capacitors.

In various embodiments, the resistive elements store synaptic weights of a neural network.

In various embodiments, the resistive elements store binary or multi-bit digital data.

Figure 9:
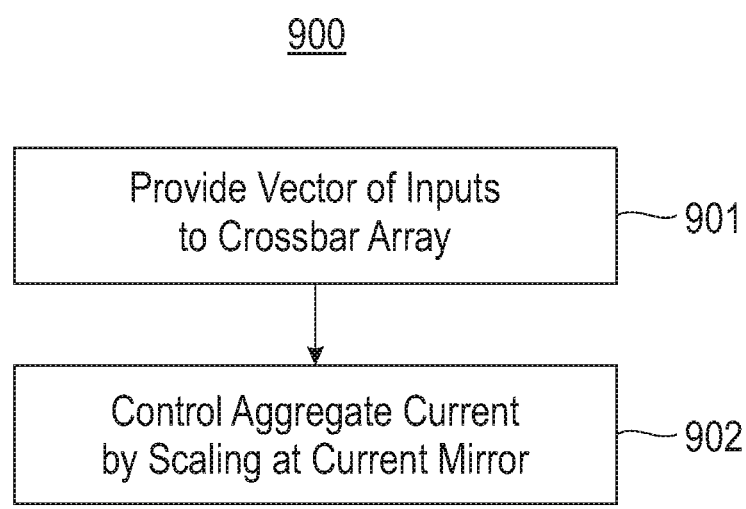
FIG. 9 illustrates a method of operating a crossbar array according to embodiments of the present disclosure.

Referring to FIG. 9, a method of operating a crossbar array is illustrated according to embodiments of the present disclosure. At 901, a vector of voltage inputs is provided to an array of resistive elements. The array is adapted to provide a vector of current outputs equal to the analog dot-product between the vector of voltage inputs and a vector of analog resistive weights within the array. First stage current mirrors are electrically coupled to a subset of the resistive elements through a local current accumulation wire. A second stage current mirror is electrically coupled to the first stage current mirrors through a global accumulation wire. Each of the first stage current mirrors includes components having respective scaling factors. At 902, an aggregate current on the global accumulation wire is controlled by selecting a scaling factor for the components of the first stage current mirrors.

Figure 10:
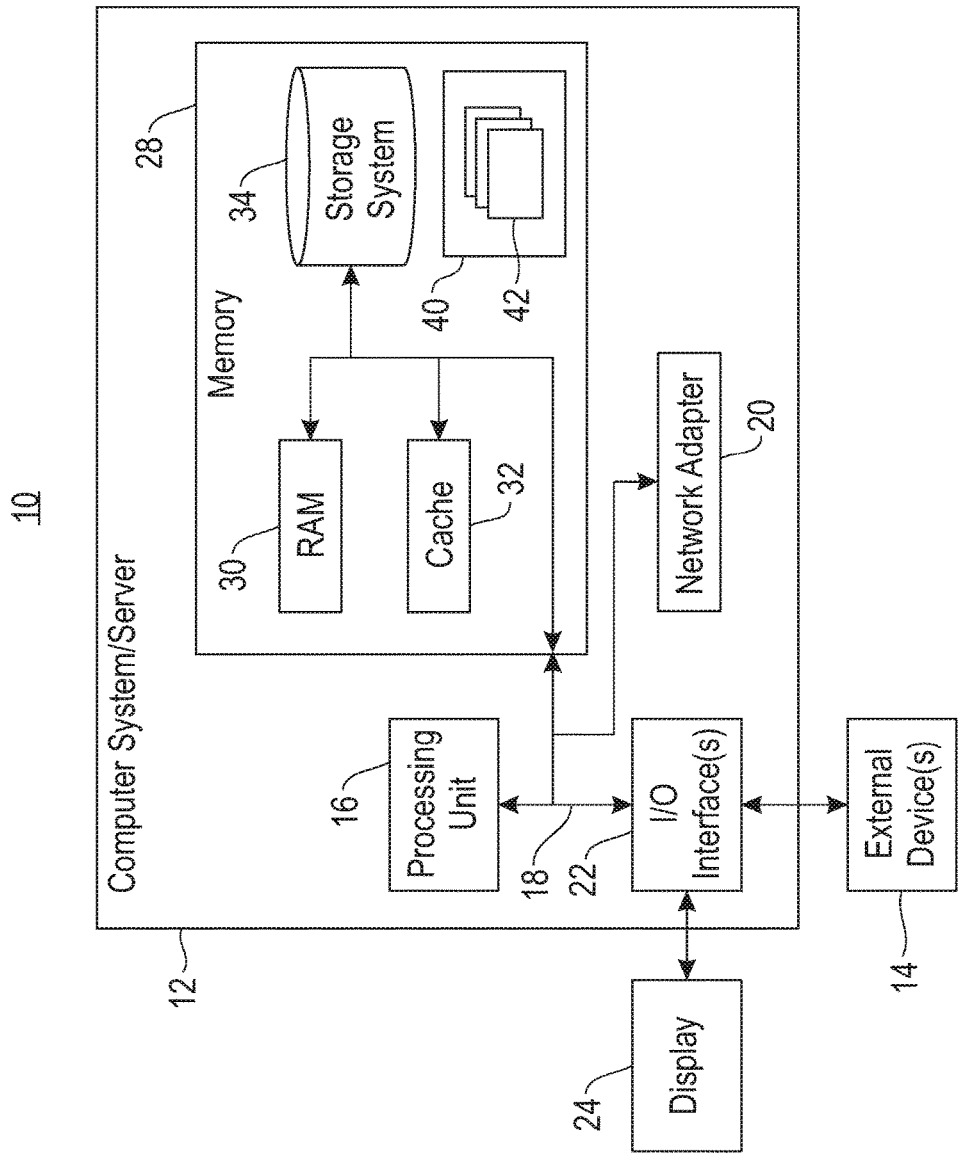
FIG. 10 depicts a computing node according to an embodiment of the present disclosure.

Referring now to FIG. 10, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit, comprising:
   an array of resistive elements, the array providing a vector of current outputs equal to the analog vector-matrix product between (i) a vector of voltage inputs to the array encoding a vector of analog input values and (ii) a matrix of analog resistive weights within the array;
   first stage current mirrors, each of the first stage current mirrors being electrically coupled to a subset of the resistive elements through a local current accumulation wire; and
   a second stage current mirror, the second stage current mirror being electrically coupled to the first stage current mirrors through a global accumulation wire, wherein
   each of the first stage current mirrors includes at least one component having respective scaling factors selectable to scale the current in the local current accumulation wire, thus controlling the aggregate current on the global accumulation wire.

2. The circuit of claim 1, further comprising:
   a time-gating circuit adapted to periodically enable at least one of the first stage and/or second stage current mirrors, thereby controlling the fraction of time during which current is applied to the global accumulation wire.

3. The circuit of claim 1, the second stage current mirror comprising at least one component having scaling factors selectable to scale the current from the global current accumulation wire.

4. The circuit of claim 1, further comprising:
   a plurality of local accumulation wires, each of which is connected to a respective subset of the resistive elements.

5. The circuit of claim 1, wherein the subset of resistive elements corresponds to one or more columns of the array.

6. The circuit of claim 1, wherein the subset of resistive elements corresponds to one or more rows of the array.

7. The circuit of claim 1, wherein the resistive elements are non-volatile memory devices.

8. The circuit of claim 1, wherein the resistive elements are transistors whose gate terminals are connected to respective capacitors.

9. The circuit of claim 1, wherein the resistive elements store synaptic weights of a neural network.

10. A circuit, comprising:
    an array of resistive elements, the array providing a current output equal to the strength of a stored analog resistive weight within the array;
    first stage current mirrors, each of the first stage current mirrors being electrically coupled to a subset of the resistive elements through a local current accumulation wire; and
    a second stage current mirror, the second stage current mirror being electrically coupled to the first stage current mirrors through a global accumulation wire, wherein
    each of the first stage current mirrors includes at least one component having respective scaling factors selectable to amplify the current in the local current accumulation wire, thus controlling the aggregate current on the global accumulation wire.

11. The circuit of claim 10, further comprising:
    a time-gating circuit adapted to periodically enable at least one of the first stage and/or second stage current mirrors, thereby controlling the fraction of time during which current is applied to the global accumulation wire.

12. The circuit of claim 10, the second stage current mirror comprising at least one component having scaling factors selectable to amplify the current from the global current accumulation wire.

13. The circuit of claim 10, further comprising:
    a plurality of local accumulation wires, each connected to a subset of the resistive elements.

14. The circuit of claim 10, wherein the subset of resistive elements corresponds to one or more columns of the array.

15. The circuit of claim 10, wherein the subset of resistive elements corresponds to one or more rows of the array.

16. The circuit of claim 10, wherein the resistive elements are non-volatile memory devices.

17. The circuit of claim 10, wherein the resistive elements are transistors whose gate terminals are connected to respective capacitors.

18. The circuit of claim 10, wherein the resistive elements store synaptic weights of a neural network.

19. A method, comprising:
    providing a vector of voltage inputs to an array of resistive elements, the array adapted to provide a vector of current outputs equal to the analog dot-product between the vector of voltage inputs and a vector of analog resistive weights within the array, wherein
first stage current mirrors are electrically coupled to a subset of the resistive elements through a local current accumulation wire,
a second stage current mirror is electrically coupled to the first stage current mirrors through a global accumulation wire, and
each of the first stage current mirrors includes components having respective scaling factors; and;
controlling an aggregate current on the global accumulation wire by selecting a scaling factor for the components of the first stage current mirrors.

* * * * *